United States Patent
Thurgate et al.

(10) Patent No.: US 6,908,816 B1
(45) Date of Patent: Jun. 21, 2005

(54) METHOD FOR FORMING A DIELECTRIC SPACER IN A NON-VOLATILE MEMORY DEVICE

(75) Inventors: Timothy Thurgate, Sunnyvale, CA (US); Nga-Ching Wong, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/696,234

(22) Filed: Oct. 28, 2003

(51) Int. Cl.[7] .............................................. H01L 21/336
(52) U.S. Cl. ........................ 438/261; 438/262; 438/595
(58) Field of Search .............................. 438/261, 262, 438/595

(56) References Cited

U.S. PATENT DOCUMENTS 6,303,959 B1 * 10/2001 Ratnam ...................... 257/314
6,551,880 B1 * 4/2003 Lai et al. .................... 438/261
6,699,753 B2 * 3/2004 Ma et al. .................... 438/257
6,833,581 B1 * 12/2004 Hui et al. .................... 257/317

* cited by examiner

*Primary Examiner*—David Nelms
*Assistant Examiner*—Quoc Hoang

(57) ABSTRACT

Embodiments of the present invention relate to a method for fabricating a Vss line in a memory device, which comprises: forming a plurality of memory cells above a semiconductor substrate, forming a channel between two of the memory cells, forming an oxide/nitride/oxide stack above the memory cells and the channel, removing a portion of the oxide/nitride/oxide stack between the memory cells to expose the semiconductor substrate, removing the oxide/nitride/oxide stack above the gates of the memory cells, forming a plurality of source regions in the substrate between the memory cells, forming a poly-silicon layer above the memory cells and the channel to connect to the source regions, and removing a sufficient portion of the poly-silicon layer to form a Vss line.

10 Claims, 13 Drawing Sheets

(SECTION A-A)

(SECTION B-B)

METHOD FOR FORMING A DIELECTRIC SPACER IN A NON-VOLATILE MEMORY DEVICE

FIELD OF THE INVENTION

The present invention relates to the field of semiconductor device manufacture. Specifically, the present invention pertains to a Vss line in a flash memory cell and a method for forming such a line.

BACKGROUND OF THE INVENTION

As semiconductor devices continue to become smaller and smaller, new techniques arise in achieving ever decreasing footprints for device functionality. Memory devices, especially, because there are many millions of identical cells in a single memory chip, are the focus of intensive miniaturization efforts.

Modern memory devices are employing characteristic feature sizes approaching 100 nm, with even smaller device sizes on the technology horizon. Continued shrinking pushes the limits of physics by putting features in such proximity that electrical isolation and electrical connection to cells is very difficult.

One of the techniques used to achieve the isolation such miniaturization requires is Shallow Trench Isolation (STI) which enables closer feature proximity on a chip than previously possible. Some memory devices, with millions of memory gates in a single chip, also employ trenches, or channels, to provide pathways for supplying connections to the sources (Vss) and drains of memory gates.

A flash or block erase memory (flash memory), such as Electrically Erasable Programmable Read-Only Memory (Flash EEPROM) includes an array of cells which can be independently programmed and read. The size of each cell and thereby the memory as a whole are made smaller by eliminating the independent nature of each of the cells. As such, all of the cells are erased together as a block.

A memory of this type includes individual Metal-Oxide Semiconductor (MOS) memory cells that are field effect transistors (FETs). Each FET, or flash, memory cell includes a source, drain, floating gate and control gate to which various voltages are applied to program the cell with a binary 1 or 0, or erase all of the cells as a block. Programming occurs by hot electron injection in order to program the floating gate and a programming charge is typically stored in the floating gate between a tunnel oxide and a control gate. The programming charge is contained by an isolating layer which is often an oxide/nitride/oxide stack. Erasure employs Fowler-Nordheim tunneling effects in which electrons punch through the thin dielectric layer, thereby reducing the amount of charge on the floating gate. Erasing a cell generally sets the logical value of the cell to "1," while programming a cell sets the logical value to "0." The flash memory cell provides for nonvolatile data storage which remains stable without power for upwards of ten years.

Conventional Art FIG. 1 illustrates a typical configuration of a plan view of a section of a memory array, 100, in a common configuration for a memory device. Conventional Art FIG. 1 is not drawn to scale. As shown in Conventional Art FIG. 1, array 100 comprises rows 110 and columns 120 of memory cells. Each of the memory cells are isolated from other memory cells by insulating layers (e.g., a plurality of shallow trench isolation regions (STI) 112. The control gates of each of the memory cells are coupled together in each of the plurality of rows 110 of memory cells, and form a plurality of word lines 101 that extend along the row direction. Bit lines extend in the column direction and are coupled to drain regions via drain contacts 108, which are typically "vias" in an associated column of memory cells 120.

A plurality of source lines (Vss) 102 extend in the row direction and are coupled to, and comprise, the source regions of each of the memory cells in the array of memory cells 100. One source line provides the source regions in adjoining rows of memory cells, and as a result, one source region is shared between two memory cells. Similarly, drain regions are shared amongst adjoining rows of memory cells, and as a result, one drain region is shared between two memory cells.

Conventional art FIG. 1B, (Section A—A) illustrates the depth relationship between STI 112, source/Vss lines 102 and drains 118. As is illustrated in Conventional Art FIG. 1C, the source/Vss lines 102 are typically formed by ion implantation 150 in the silicon substrate of the memory device. The drain regions are also formed by ion implantation, 151. Because the source implantation must be formed in the substrate under the existing STI trench and between existing cells, the ion energies required are very large, on the order of $2e^{15}$ eV. In order to provide a continuous source line, the implantation bean must be angled to provide implantation in the STI trench walls. The angles are on the order of twenty degrees from vertical. The large implantation energies also form the conductive extension of the source regions under the memory cells. As cell sizes shrink, the insulative region between source and drain, 161, can narrow to the point of shorting the memory cell.

What is needed, then, is a method for forming a Vss connection that provides the requisite continuity between source regions without shrinking the isolation between source and drain. Furthermore, the method must be achievable using existing manufacturing methods.

SUMMARY OF THE INVENTION

Accordingly, embodiments of the present invention present a means of reducing the requisite memory device footprint by forming a Vss line above the substrate and STI trenches, thus obviating the need for high energy Vss ion implantation and the associated reduction in source/drain isolation. Furthermore, devices employing such are able to be fabricated using existing semiconductor fabrication processes.

Specifically, embodiments of the present invention relate to a method for fabricating a Vss line in a memory device, which comprises: forming a plurality of memory cells above a semiconductor substrate, forming a channel between two of the memory cells, forming an oxide/nitride/oxide stack above the memory cells and the channel, removing a portion of the oxide/nitride/oxide stack between the memory cells to expose the semiconductor substrate, removing the oxide/nitride/oxide stack above the gates of the memory cells, forming a plurality of source regions in the substrate between the memory cells, forming a poly-silicon layer above the memory cells and the channel to connect to the source regions, and removing a sufficient portion of the poly-silicon layer to form a Vss line.

These and other objects and advantages of the present invention will become obvious to those of ordinary skill in the art after having read the following detailed description of the preferred embodiments which are illustrated in the various drawing figures.

BRIEF DESCRIPTION OF THE DRAWINGS

The operation of this invention can be best visualized by reference to the drawings.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail so as not to unnecessarily obscure aspects of the present invention.

Figure 1A:
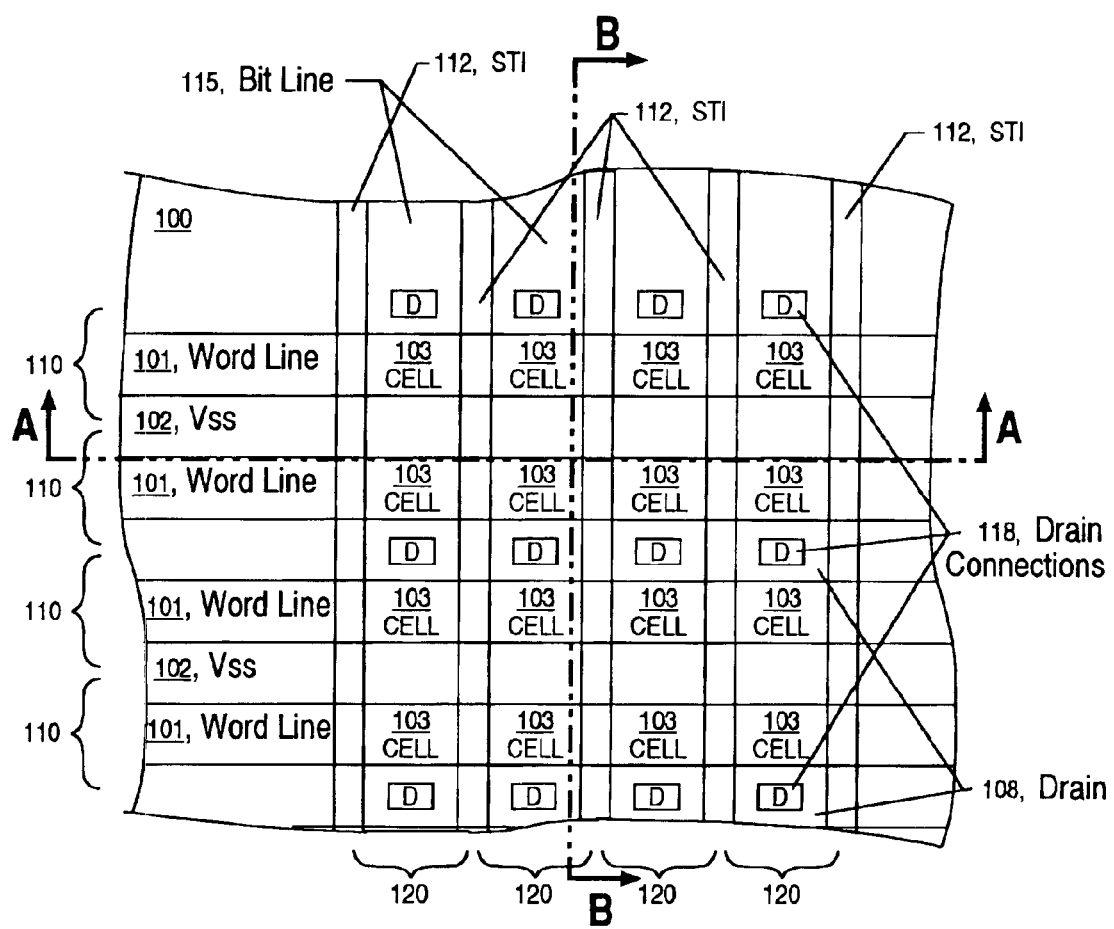
FIG. 1A (Conventional Art) illustrates an exemplary planar view of a memory device.
Figure 1B:
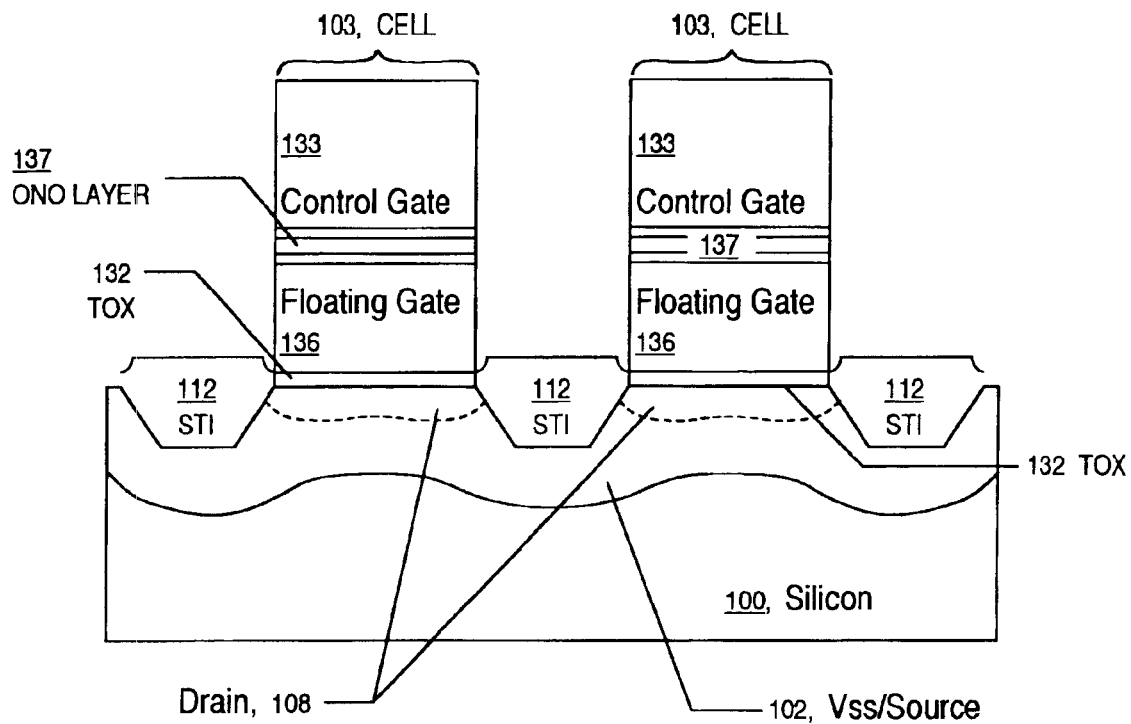
FIG. 1B (Conventional Art) illustrates an exemplary section (A—A) view of a portion of a memory device.
Figure 1C:
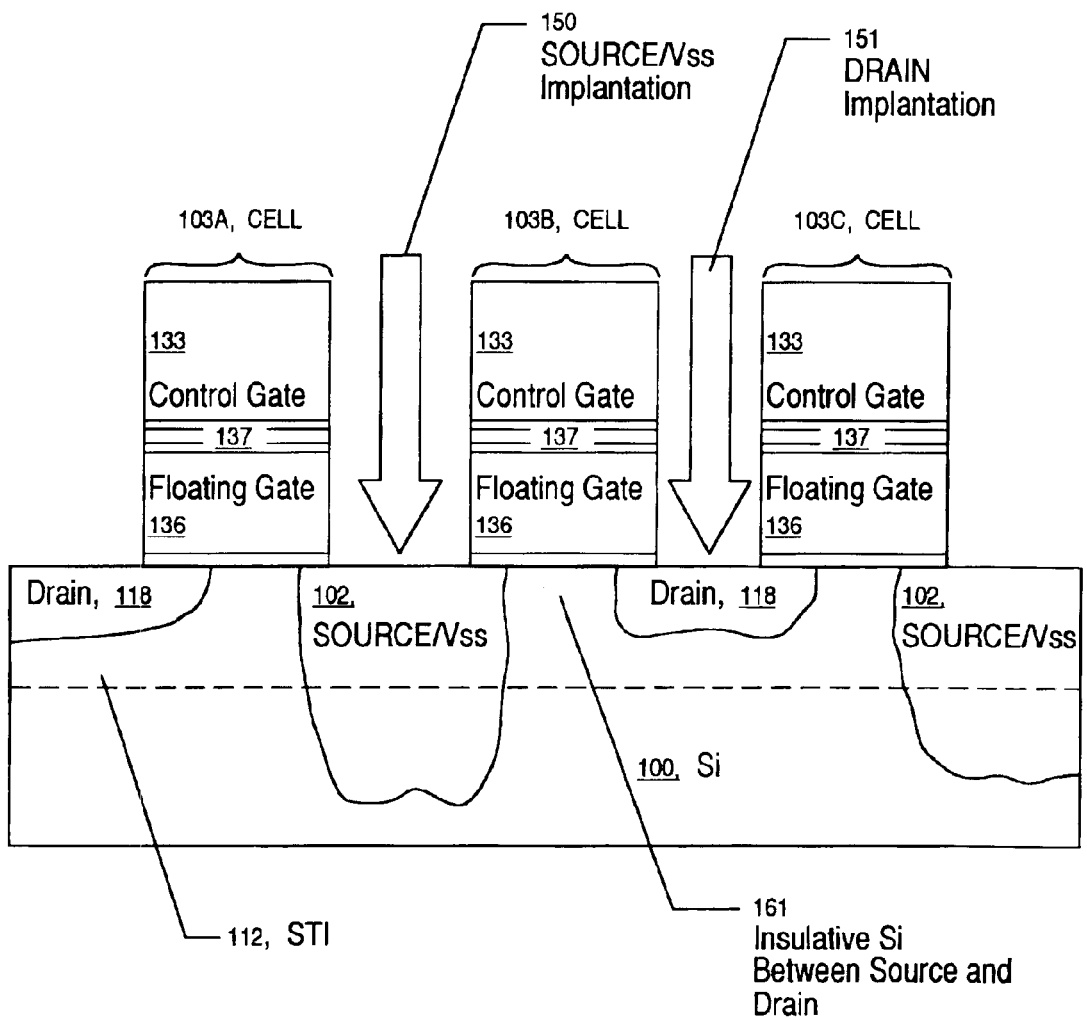
FIG. 1C (Conventional Art) illustrates an exemplary section (B—B) view of a portion of a memory device.
Figure 2:
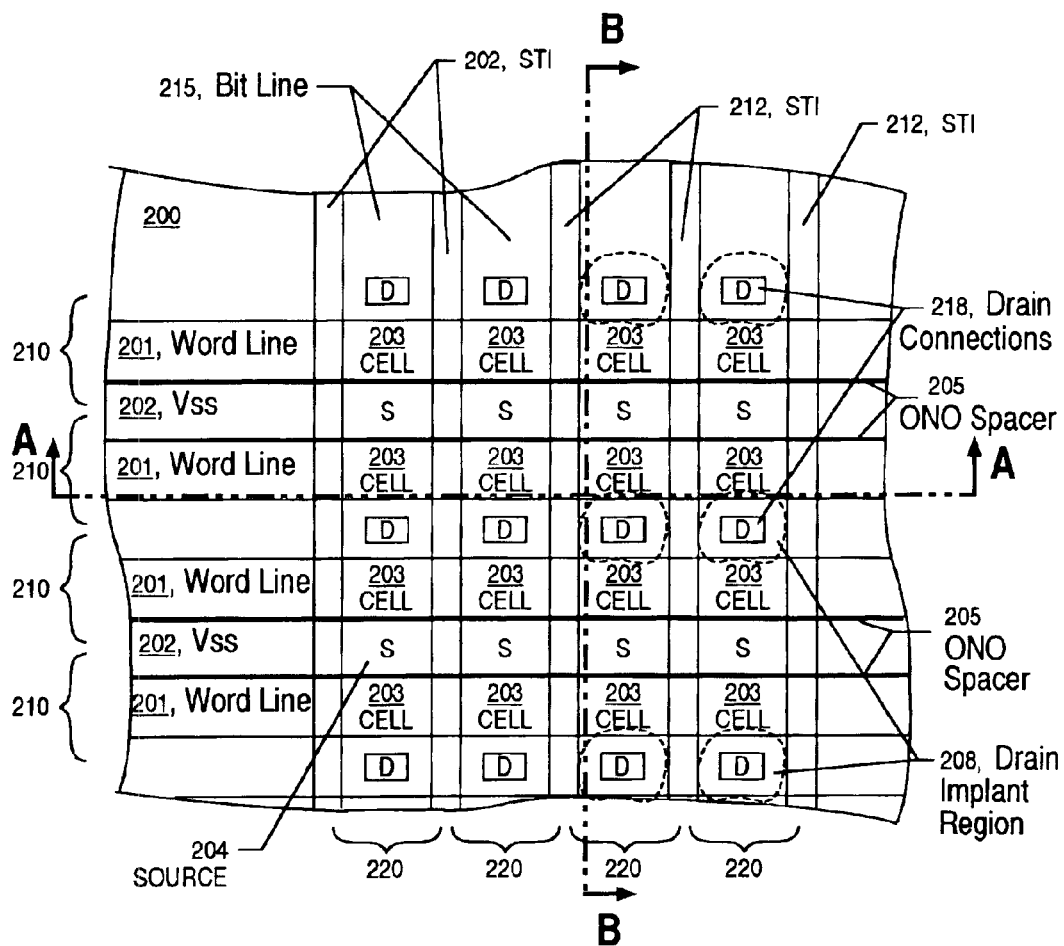
FIG. 2 illustrates a planar view of a memory device in accordance with embodiments of the present invention.

A planar view of an embodiment of the present invention is illustrated in FIG. 2. Memory cell array 200 comprises rows, 210, and columns, 220, of memory cells, 203. Each memory cell is isolated from other memory cells by channels. Each cell 203 comprises a gate connected to a source 204 and a drain 208. Each source 204 in a row is coupled to a Vss line 201 and is coupled to one cell 203 each from two parallel word line rows of cells.

As an example, a plurality of non-intersecting shallow trench isolation regions (STI), 112, isolate memory cells along the column direction, and a plurality of source voltage supply lines (Vss), 202, isolate memory cells in the row direction. In memory array 200, bit lines 215 are shown superimposed over memory cells 203. Bit lines 215 connect to the drain regions of columns of memory cells 203. The bit lines 215 are oriented in a columnar direction and, in FIG. 2, are located above (closer to the viewer than) the word lines 201 oriented in the row direction. The connection to the drain regions 208 is by drain connection vias 218.

In an embodiment of the present invention, Vss lines 202, comprised of conductive poly silicon, are disposed above, and directly coupled to, source regions 204. The Vss lines are isolated from the memory cells 203 by oxide/nitride/oxide (ONO) spacers, 205, in this embodiment of the present invention. The ONO spacers are disposed between each Vss line 202 and adjacent memory cells 203. The high dielectric ONO spacer provides enhanced isolation for Vss and the memory cells 203, allowing closer spacing of the memory cells and thus a smaller device footprint while still supplying the voltage necessary for source function.

FIG. 2 is exemplary only, and the pattern of word lines, Vss lines, and bit lines can be altered for performance reasons. For example, each of the plurality of Vss lines 202 of FIG. 2 is a common source line, shared between two rows of cells, but could easily be formed as an unshared source line. In addition, the pattern of word lines, Vss lines, and bit lines coupled to the array of memory cells 200 is shown in a NOR type configuration. However, other embodiments are well suited to arrays of other logical configurations.

Source regions 204, are formed by ion implantation in the silicon substrate of memory array 200. Ion implantation, by virtue of high energies imported to n-type dopants, converts semiconductor silicon to conductive silicon. Typical source n-type implant dopants can be taken from a group consisting of arsenic, phosphorous, and antimony in one embodiment; however, other embodiments are well suited to any n-type dopants suitable for fabrication of a core array of memory cells. As shown in the example of FIG. 2, the Vss line 202 is formed parallel to each of the plurality of rows of memory cells 203.

FIG. 2 also illustrates connection for drain regions 208. Drains 208 are coupled, in this embodiment, though vias 218 to bit lines 215. While in other embodiments bit lines 215 can be other locations or orientations, this embodiment implements bit lines 215 above and isolated from word lines 201. Bit lines 215, in this embodiment, connect columns of drain contacts 218.

FIGS. 3A through 3H illustrate the formation of a Vss line 202 for providing electrical coupling to the source regions of each of the memory cells in the array 200, in accordance with embodiments of the present invention. Vss line 202, in embodiments of the present invention, is formed of highly conductive poly silicon in the channel above implanted source regions. The Vss lines are also, because of their location, formed above the shallow trench isolation channels 212. It is noted that the view shown in FIGS. 3B through 3G is along the row direction, parallel to the eventual location of the Vss lines 202 and word lines 201.

Figure 3A:
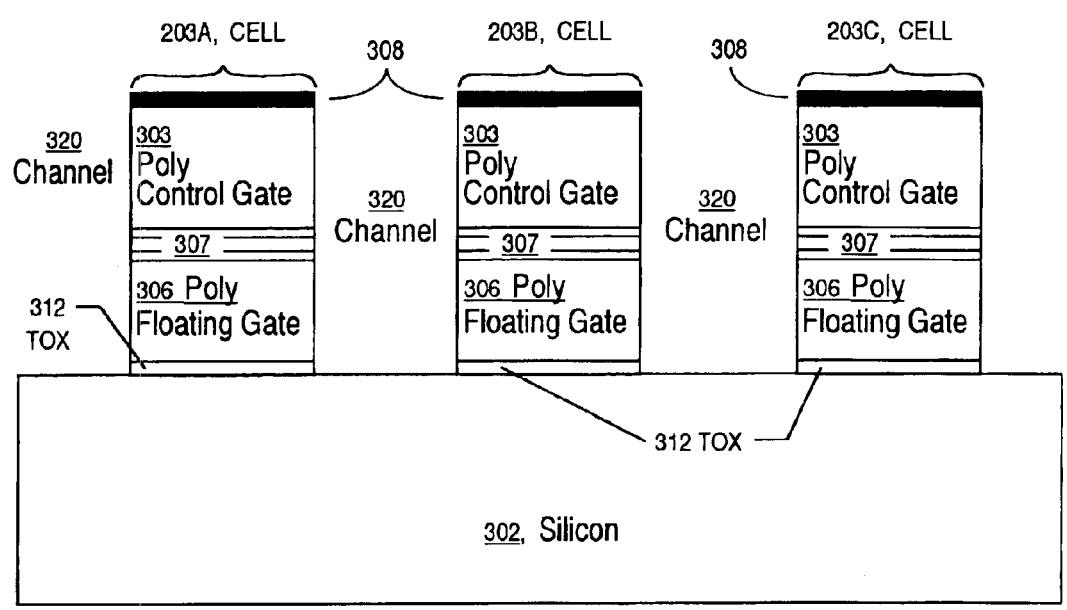
FIG. 3A illustrates a cross sectional (B—B) view of a memory device in accordance with embodiments of the present invention.

In FIG. 3A, the memory cells 203 of this embodiment of the present invention are formed of a thin tunnel oxide layer (TOX), 312, above the substrate 302, followed by a polycrystalline silicon (poly) floating gate layer 306 above the tunnel oxide layer, then an oxide-nitride-oxide (ONO) isolation barrier 307 above the floating gate and a control gate 303 of poly silicon above the ONO barrier, then a protective layer 308 above the control gate. The memory cells 203 are isolated into separate cells by etching channels 320 to remove excess material down to the substrate surface.

Isolating ONO barrier 307 is fabricated in the following manner. A first oxide layer is formed above the floating gate Poly, 306. Then a nitride layer is formed above the first oxide layer. Then a second oxide layer is formed above the nitride layer. The formed ONO stack provides an isolation layer of a very high-dielectric that that prevents a stored charge in the floating gate from migrating to the control gate. It is noted that the isolation barrier is part of the isolation of a memory cell in long term memory that allows a stored charge to remain stored in a cell for an extended period, on the order of ten years, without power. The control gate layer poly 303 is then formed above the ONO stack and the temporary protective layer 308 is formed above the control gate.

Figure 3B:
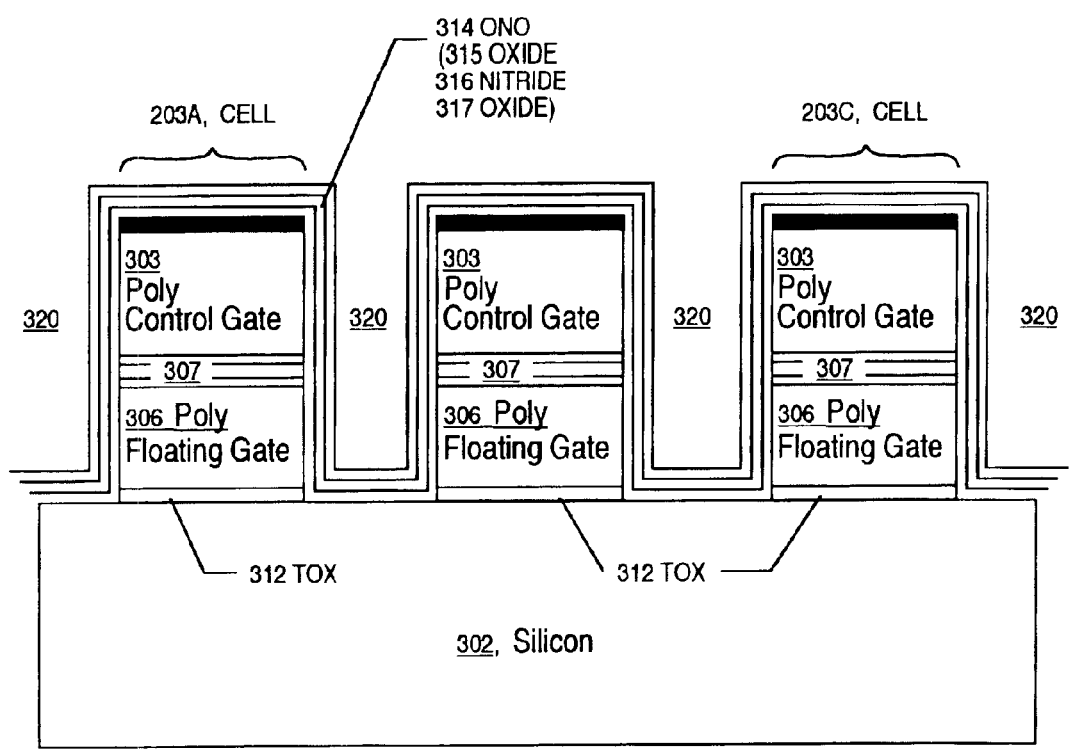
FIG. 3B illustrates a cross sectional (B—B) view of the memory device of FIG. 3A in accordance with embodiments of the present invention.

In FIG. 3B the fabrication process is continued by the formation of an ONO layer 314 above the array of cells 203 and channels 320. The ONO layer 314 is formed, as before, by forming a first oxide layer 315, above the array, then forming a nitride layer 316 above the first oxide layer, then forming a second oxide layer 317 above the nitride layer. This second ONO layer provides the channel wall isolation for each cell in the relatively deep channels, 320, which separate, in this illustration, rows of individual memory cells. The channels will provide access for source and drain implantation in the substrate between the cells and the ONO layer provides protection to the cells during the implantation process.

Figure 3C:
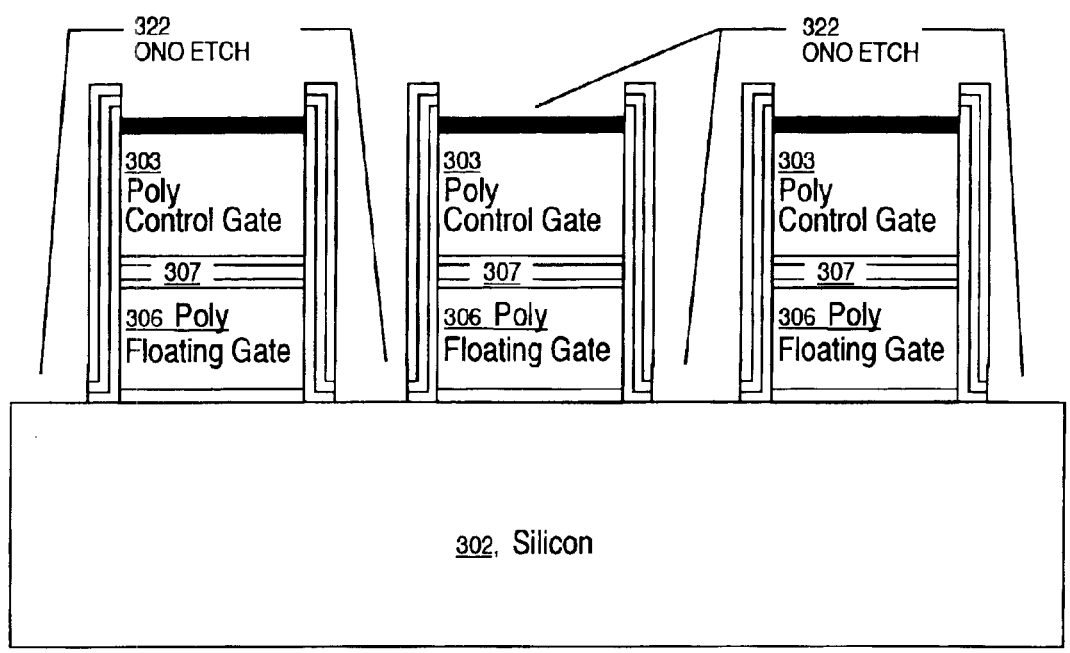
FIG. 3C illustrates a cross sectional (B—B) view of the memory device of FIG. 3B in accordance with embodiments of the present invention.

In this embodiment of the present invention, as shown in FIG. 3C, the ONO layer 314 is etched away 322 from the bottom of channels 320 to provide access to the substrate for implantation and for subsequent electrical coupling between the source regions and Vss lines, as well as between the drain regions and their associated drain vias. The ONO layer is etched away above the protective layers 308 above each cell in the same process.

Figure 3D:
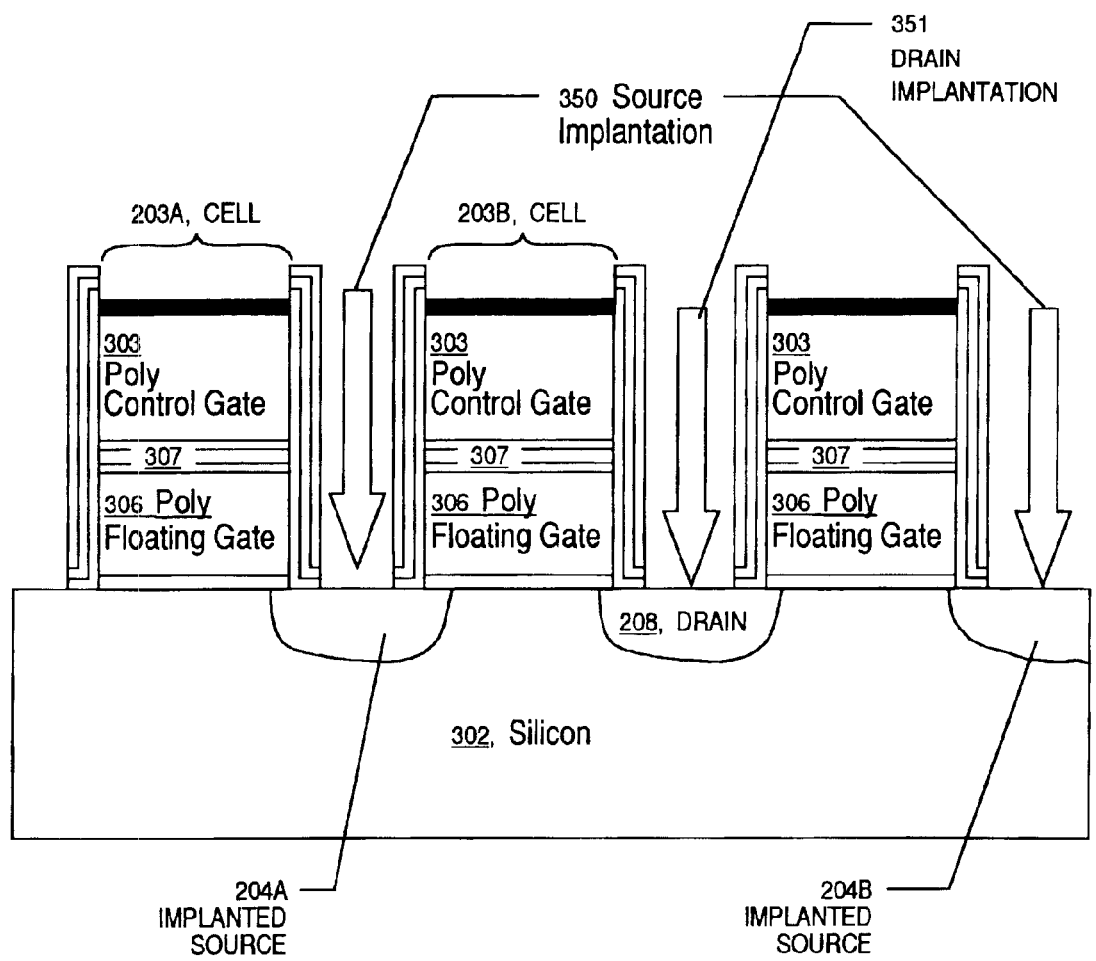
FIG. 3D illustrates a cross sectional (B—B) view of the memory device of FIG. 3C in accordance with embodiments of the present invention.

Source 204 and drain 208 regions are fabricated as shown in FIG. 3D. The source regions 204 are formed, in embodiments of the present invention, by ion implantation, 350, in the silicon substrate. Drain regions 208 are formed in implantation process 351. It is noted that the enhanced isolation that is ultimately provided by ONO spacers in the channels, 320, allows source and drain regions to be smaller and implantation can be accomplished with lower energies than be would required with the larger regions which would be necessary without enhanced isolation. The regions as shown in FIG. 3D are formed with implantation energies as low as 20 KeV. It is noted here that each source and drain region is shared between two adjacent memory cells. In FIG. 3D, for example, source region 204A is shared between memory cells 203A and 203B. Drain region 208, similarly, is shared between memory cells 203B and 203C. In the finished device, source regions are connected to Vss lines formed in the channel, 320. Drain regions are connected by vias to the associated bit line which is formed above the word line at the top of the defined cell structure.

Figure 3E:
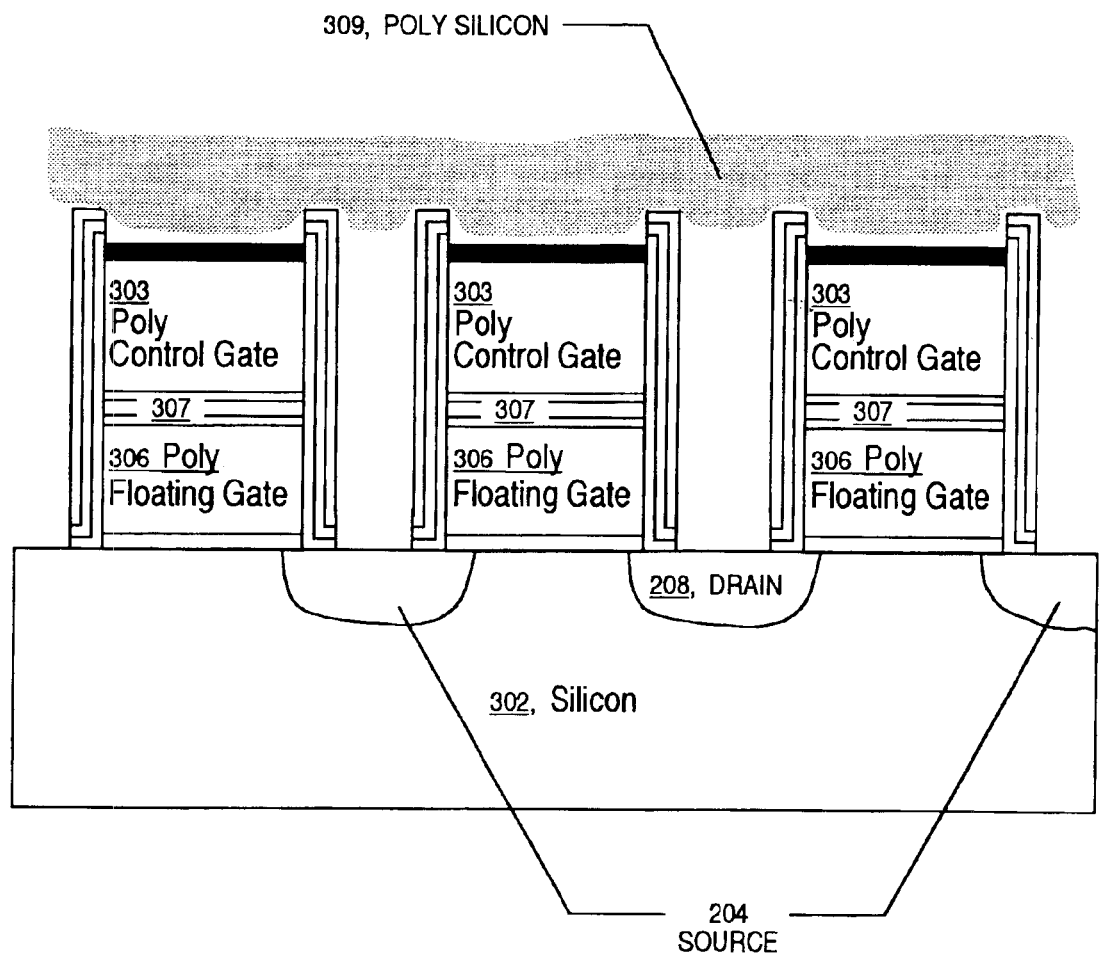
FIG. 3E illustrates a cross sectional (B—B) view of the memory device of FIG. 3D in accordance with embodiments of the present invention.

A layer of poly-silicon, 309, in this embodiment of the present invention, is then deposited as shown in FIG. 3E in order to form the Vss lines. The channels 320 are completely filled to ensure poly silicon is in full electrical contact with source regions 204. It is noted that the drain vias 218 can be formed by etching and fill in the channels 320 above drain regions.

Figure 3F:
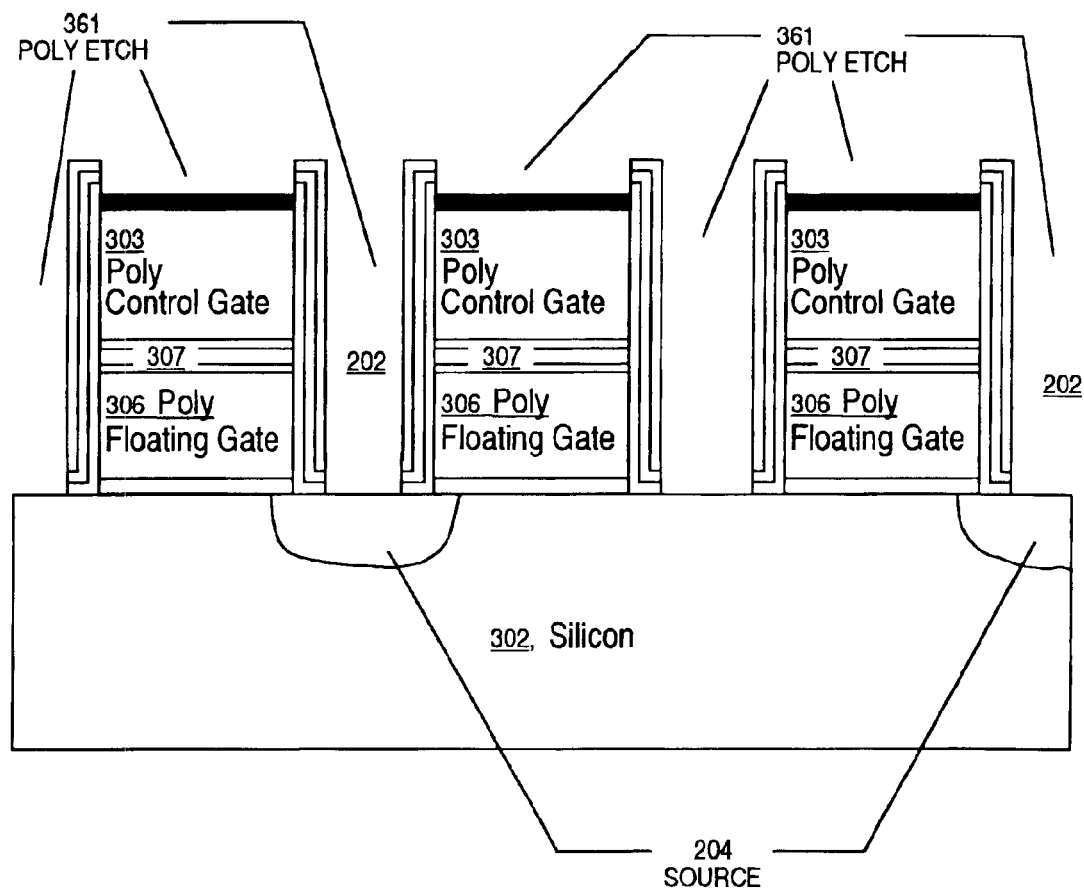
FIG. 3F illustrates a cross sectional (B—B) view of the memory device of FIG. 3E in accordance with embodiments of the present invention.
Figure 3G:
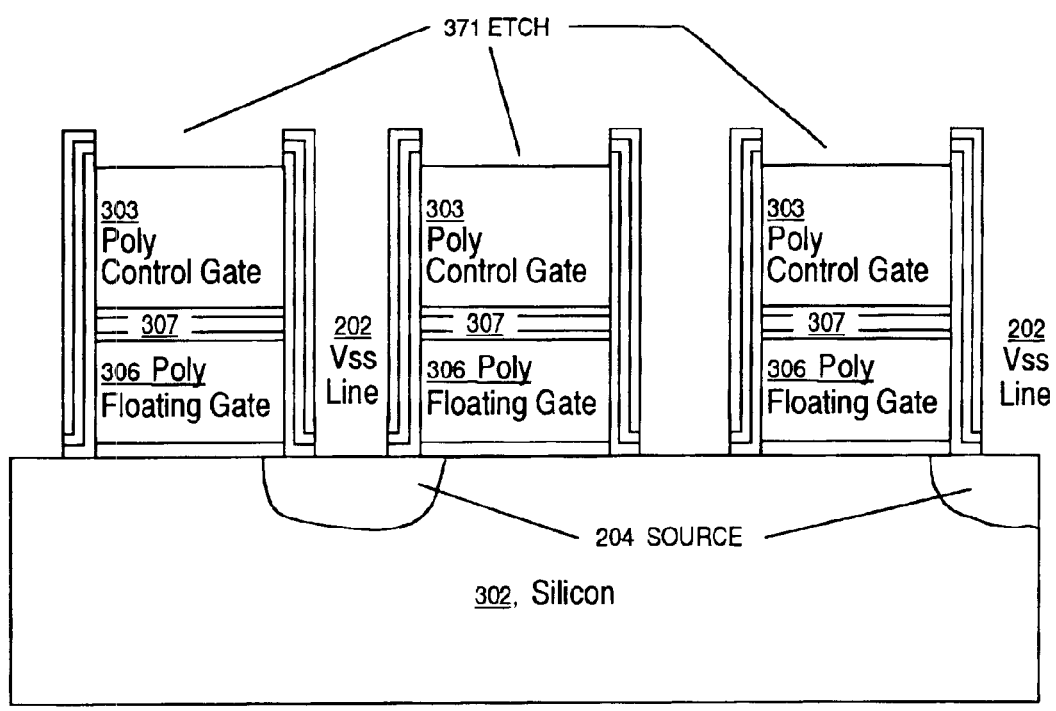
FIG. 3G illustrates a cross sectional (B—B) view of the memory device of FIG. 3F in accordance with embodiments of the present invention.

As is shown in FIG. 3F, the polysilicon is etched back, 361, to isolate the Vss lines 202 above source regions 204. The poly silicon is also etched back above the drain regions 208 and above the cells 203 and protective layers 308. In FIG. 3G, the protective layers are etched away for future word line connection. It is noted that the relationships between processes are as shown in this embodiment of the present invention but that the relationships, or order, between processes may vary in other embodiments. For example, the protective layer 308 may be etched away after the formation of the drain vias 218 or may be left intact to form connections to word lines.

Figure 3H:
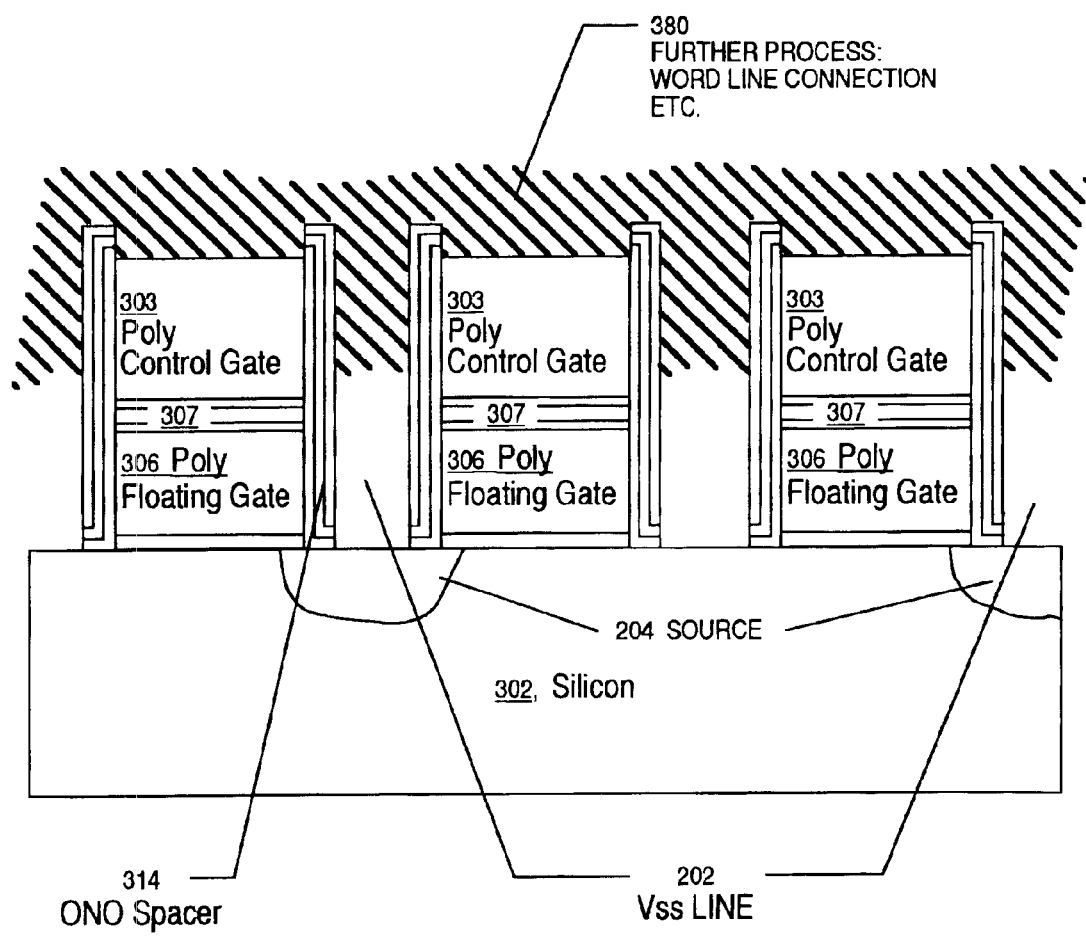
FIG. 3H illustrates a cross sectional (B—B) view of the memory device of FIG. 3G in accordance with embodiments of the present invention.

In FIG. 3H, allusion is made to other subsequent processes in the formation of a memory array. These subsequent processes can vary in various embodiments. However, the formation of an isolating layer above the Vss lines 202 allows the Vss line to carry sufficient voltage to a set of source regions in the memory array. By forming the Vss lines in this manner, the costly and time consuming steps required to form Vss lines in the silicon substrate of the array are avoided.

Figure 4:
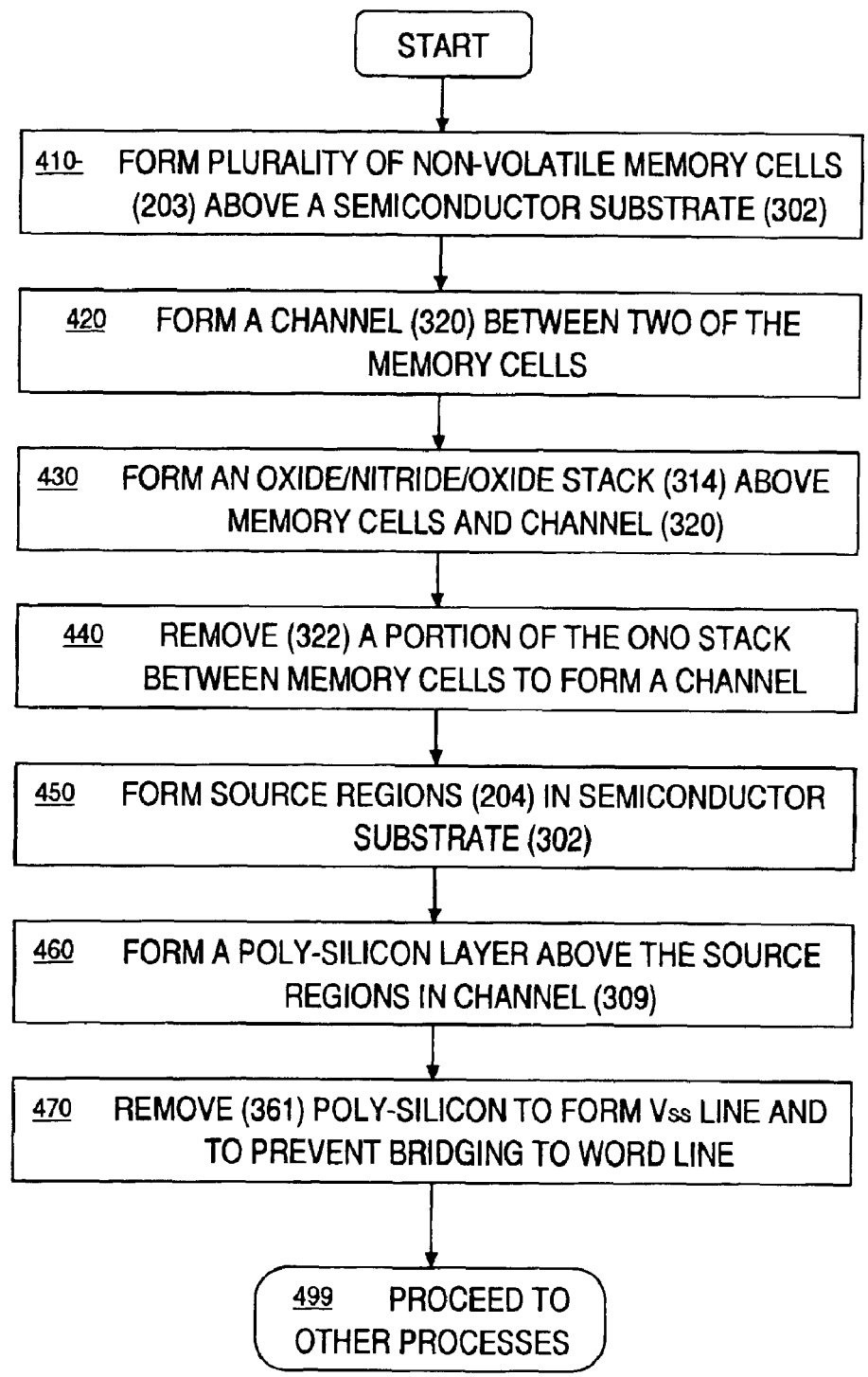
FIG. 4 illustrates a flow diagram of a semiconductor fabrication process in accordance with an embodiment of the present invention.

FIG. 4 illustrates the formation process outlined above in block flow diagram form. Process 400 begins by forming a plurality of non-volatile memory cells (203) on a silicon substrate (302), at 410. Then a channel (320) is formed between two memory cells at 420. At 430, an oxide/nitride/oxide (ONO) stack 314 is formed above the memory cells and channels. At 440, a portion of the ONO stack is removed 322 in the bottom of the channels and above the cell protective layer 308. A source region (204) is formed in the silicon substrate (302) at 450. The formation of these regions is accomplished by ion implantation 350 in the substrate. At 460, a Poly-silicon layer (309) is laid down above the memory cells and in the channels 320 above source regions 204. At 470, the poly-silicon is etched back to form the Vss line 202 above and connected to the source regions 204 and is etched back 361 far enough to avoid bridging with the word lines during subsequent silicidation and N+ implant of the control gates to form the word line connection. The word line formation and control gate silicidation and N+ implantation are formed in other processes, 499 and subsequent.

With the Vss line isolated by the ONO spacers formed in the preceding manner, Vss meets with less resistance and a shallow source junction is allowable, enabling a downscaling of the memory core device. With the enormous repetition in memory devices, a core device scaling results in a significant footprint reduction for the entire array.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A method for fabricating a Vss line in a memory device, comprising:

forming a plurality of memory cells above a semiconductor substrate;

forming a channel between two of said memory cells;

forming an oxide/nitride/oxide stack above said memory cells and said channel;

removing a portion of said oxide/nitride/oxide stack between said memory cells to expose said semiconductor substrate;

removing said oxide/nitride/oxide stack above the gates of said memory cells;

forming a plurality of source regions in said substrate between said memory cells;

forming a poly-silicon layer above said memory cells and said channel to connect to said source regions; and removing a sufficient portion of said poly-silicon layer to form a Vss line.

2. The method as recited in claim 1 wherein said memory cells are implemented as flash memory cells.

3. The method as recited in claim 2 wherein said memory cells comprise:

a tunnel oxide above said semiconductor substrate;

a floating gate above said tunnel oxide;

an isolating region above said floating gate; and a control gate above said isolating region, wherein said memory cell is programmed by storing a charge in said floating gate and current flow between said source and said drain is affected by said stored charge.

4. The method as recited in claim 3 wherein said isolating region comprises:

a first oxide layer above said floating gate;

a nitride layer above said first oxide layer; and a second oxide layer above said nitride layer.

5. The method as recited in claim 4 wherein said oxide is an oxide of silicon.

6. The method as recited in claim 4 wherein said nitride is a nitride of silicon.

7. The method as recited in claim 1 wherein said channel is a Vss channel.

8. The method as recited in claim 1 wherein said forming an oxide/nitride/oxide stack comprises:

forming a first oxide layer above said semiconductor substrate;

forming a nitride layer above said first oxide layer; and forming a second oxide layer above said nitride layer.

9. The method as recited in claim 8 wherein said oxide is an oxide of silicon.

10. The method as recited in claim 9 wherein said nitride is a nitride of silicon.

\* \* \* \* \*